United States Patent
Lee et al.

(10) Patent No.: US 8,524,593 B2
(45) Date of Patent: *Sep. 3, 2013

(54) ARRANGEMENT FOR SOLDER BUMP FORMATION ON WAFERS

(75) Inventors: Chunghsin Lee, Lynnfield, MA (US); Jian Zhang, Brookline, MA (US)

(73) Assignee: Semigear Inc, Wakefield, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/135,970

(22) Filed: Jul. 19, 2011

(65) Prior Publication Data

US 2012/0289042 A1  Nov. 15, 2012

Related U.S. Application Data

(62) Division of application No. 12/653,454, filed on Dec. 14, 2009, now Pat. No. 7,982,320, which is a division of application No. 11/482,838, filed on Jul. 7, 2006, now Pat. No. 7,632,750.

(51) Int. Cl.
*H01L 21/44* (2006.01)

(52) U.S. Cl.
USPC ........... 438/611; 438/612; 257/779; 257/780; 257/E23.023; 257/E21.508; 257/E21.515; 228/254; 228/256; 228/111.5

(58) Field of Classification Search
USPC ................. 438/455, 611, 612, 613; 257/734, 257/737, 738, 774, 778, 779, 780; 228/111.5, 228/165, 254, 256

See application file for complete search history.

(56) References Cited

U.S. PATENT DOCUMENTS

| | | | | |
|---|---|---|---|---|
| 6,056,191 | A * | 5/2000 | Brouillette et al. | 228/254 |
| 6,123,248 | A * | 9/2000 | Tadauchi et al. | 228/111.5 |
| 6,276,589 | B1 * | 8/2001 | Watts et al. | 228/33 |
| 6,329,608 | B1 * | 12/2001 | Rinne et al. | 174/261 |
| 6,425,518 | B1 * | 7/2002 | Gruber et al. | 228/256 |
| 6,452,117 | B2 * | 9/2002 | Curcio et al. | 174/262 |
| 6,540,129 | B2 * | 4/2003 | Lee | 228/262 |
| 6,609,652 | B2 * | 8/2003 | MacKay et al. | 228/254 |

* cited by examiner

*Primary Examiner* — A. Sefer
*Assistant Examiner* — Farid Khan
(74) *Attorney, Agent, or Firm* — Don Halgren

(57) ABSTRACT

An apparatus and a process for the manufacture of a solder-bump adhered wafer substrate for use in the semiconductor industry, comprising one or more of the following steps including: arranging a first compressive member and a second compressive member in an opposed, compressibly displaceable, spaced-apart relationship, with a pattern plate disposed therebetween with the pattern plate having a plurality of aligned through-holes arranged thereon; filling the through-holes with a molten solder; compressing the solder and the pattern plate between the first and second opposed compressive members to compact the solder therein and cleans the pattern plate of excess solder; chilling the pattern plate to solidify the molten solder in the through-holes; and removing the pattern plate from the spaced-apart compressive members to produce a wafer with solder bumps thereon.

18 Claims, 4 Drawing Sheets

ARRANGEMENT FOR SOLDER BUMP FORMATION ON WAFERS

BACKGROUND OF THE INVENTION

1. Field of the Invention

The present invention relates to method and apparatus for forming solder bumps on substrates such as silicon wafers for utilization in chip manufacturing in the electronics industry, and this application is a divisional application of our U.S. patent application Ser. No. 12/653,454, filed Dec. 14, 2009, now U.S. Pat. No. 7,982,320, which is a divisional of Ser. No. 11/482,838, filed Jul. 7, 2006, now U.S. Pat. No. 7,632,750, each of which are incorporated herein by reference in its entirety.

2. Prior Art

The manufacturer of integrated circuits in the production of semiconductor devices is an evolving field. Their high demand in commerce has required greater speed in their manufacture and further necessitates improvements in environmental control during their manufacture The current manufacturer of such semiconductor devices is initially accomplished by the deposition of solder at discreet points on a silicon wafer or base carrier. Such production methods to date, are very involved, utilizing complicated automatic manufacturing techniques. For example, U.S. Pat. No. 6,832,747 to Cordes et al, shows a process for utilizing hybrid molds for a molten solder screening process. This process developed a pyramidal shaped cavity for producing solder balls on a substrate.

A further example of the prior art, is shown in U.S. Pat. No. 6,708,872 to Gruber et al. This particular prior art shows a plurality of steps for applying a solder to a substrate, utilizing a variety of steps including alignment plates and associated procedures therewith which makes the process somewhat complicated.

It is an object of the present invention to overcome the disadvantages of the prior art.

It is a further object of the present invention, to provide a method and an apparatus for applying a solder to a substrate, in an environmentally safe arrangement not shown or suggested by the prior art.

It is yet a further object of the present invention, to minimize the number of steps by the apparatus utilized in the production of a silicon substrate having solder bumps thereon.

BRIEF SUMMARY OF THE INVENTION

The present invention relates to method and apparatus for generating, depositing and forming an accurate array of solder bumps on a substrate such as a wafer of for example, silicon, or on a layer of plate glass. These solder bumps are utilized to form an array of electrical contacts on that substrate, wafer of plate, for subsequent use in the electronics industry.

The apparatus of the present invention comprises a solder-loading assembly consisting of a first or lower plate and a second or upper plate. The first or lower plate of the assembly may be movably supported on lower plate drive and the second or upper plate may be supported by an upper plate drive for compressably advancing the lower and upper plates toward and apart from one another. The lower plate arrangement of the assembly may be removably disposed within a liquid solder bath or received within a solder deposition application arrangement.

A mold plate or pattern plate is arranged in proper alignment on the first or lower plate during operation of the solder-loading assembly. The pattern plate has a plurality of properly aligned "through-holes" disposed thereon. The pattern plate is alignably disposed on the first or lower plate in the solder bath or solder-deposition arrangement so as to supply completely void-free molten solder in those through-holes thereon. The first or lower plate and the second or upper plate are then brought pressingly together facing one another with the now solder-filled pattern plate sandwiched therebetween. During this compression stage between the first or lower plate and the second or upper plate, the pattern plate is chilled through a temperature sufficient to solidify the solder in the through-holes in that pattern plate.

The now solidified solder in the now excess-solder-clear pattern plate is transferred to an awaiting substrate such as for example, a silicon wafer, or a plate glass substrate, in proper alignment therewith. The wafer or substrate to which the pattern plate is disposed, may be resting upon or in contact with a wafer supporting base with a heater and or chill means arranged therewithin. The wafer substrate and pattern plate may then be heated to a temperature above the melting point of the solder within the through-holes of the pattern plate. The now aligned through-holes adheringly deposit their bumps of solder onto the aligned wafer therebeneath or thereadjacent. The patterned plate is then removed from the wafer substrate with the solder bumps on their particular pads on the now cooled wafer or substrate therebeneath or thereadjacent. That substrate or wafer with the solder bumps thereon may now be removed from its chill plate base for subsequent further processing.

In a further embodiment of the present apparatus, the first or lower compression plate may have a slightly convex or cylindrically shaped uppermost surface thereon and the second or upper plate may have a corresponding cylindrically or a somewhat convex shaped surface thereon so as to provide a rollable or rockable "squeegee" effect to a pattern plate supportably compressed therebetween. Such a curved upper plate and correspondingly curved lower support plate could be articulated side-to-side to provide a squeezing and excess solder-removal action to a pattern plate with its associated through-holes with temporarily molten solder. Such excess solder removal would thus shorten the manufacturing process by combining several steps into one operation of filling those through-hole and cleaning the surface of the pattern plate almost simultaneously.

A further embodiment of the compression operation as applied to a pattern plate, comprises the advancement of a pattern plate with its respective aligned through-holes therewith being pulled preferably vertically, from a solder bath, while being rolled or "squeegeed" between a pair of compressive members. Such compressive members in a preferred embodiment thereof, would comprise a pair of biasedly-opposed rollers compressing and advancing a pattern plate therebetween, thus compressing each individual through-hole therebetween and simultaneously "squeegeeing" any access molten solder therefrom. Such compression and squeegeeing would thus foreshorten such a manufacturing method. The biasedly opposed pair of roller apparatus or squeegee members may be correspondingly chilled, so as to chill the molten solder in those through-holes in that particular pattern plate.

Such a pattern plate may have in one example, a straight through-bore or hole therethrough. In another further embodiment of that pattern plate, the through-hole may be tapered, so as to create a tapered or conical shape to a solder bump subsequently applied to a substrate.

In yet a further embodiment of the through-hole configuration in a pattern plate, a hemispherical depression is arranged on one side of the pattern plate, with a through-hole in the other side of that pattern plate in communication with the hemispherical depression. A yet further embodiment of the through-hole configuration for a pattern plate would be a hour-glass or pinched-waist configuration to the through-hole, wherein that pattern plate may be etched away on deposition of that pinched-waist configuration of solder applied to a wafer or substrate.

A still further configuration of that through-hole in a pattern plate may be a straight bore therethrough with a slot arrangement disposed on both the top side and the lower side of the patterned plate to provide a "keyway" effect therewithin.

Alignment of a patterned plate and a wafer or substrate in the prior art is often an operation which consumes time and expense. One such apparatus for minimizing the expense, the time and the possible inaccuracies associated therewith, would be to present an apparatus for supporting the patterned plate in a hinged-correspondence to a plate for supporting the wafer. Moving the support for the patterned plate and the wafer via a hinged support arrangement, to provide automatic and prompt alignment therebetween preceding a heating and chilling operation therewith for the deposition of those solder bumps onto that wafer is presented herewith.

The invention thus comprises a process for the manufacture of a wafer substrate for use in the semiconductor industry, comprising one or more of the following steps: arranging a first compressive member and a second compressive member in an opposed, compressibly displacable, spaced-apart relationship, with a pattern plate disposed therebetween, the pattern plate having a plurality of aligned through-holes arranged thereon; filling the through-holes with a molten solder; compressing the solder and the pattern plate between the first and the second opposed compressive members to compact the solder therein and cleans the pattern plate of excess solder; chilling the pattern plate to solidify the molten solder in the through-holes; and removing the pattern plate from the spaced-apart compressive members. The process may include placing the pattern plate on the wafer substrate in an aligned manner; heating the solder in the through-holes in the pattern plate to as to melt and cause adherence of the solder to the wafer as solder bumps thereon. The first compressive member and the second compressive member may have correspondingly curved facing surfaces to effect an excess solder removal operation during compression of the pattern plate therebetween. The compressive members may be plates. The curved facing surfaces of the compressive members may be of convex shape. The curved facing surfaces of the compressive members may be of slightly cylindrical shape. The compressing of the pattern plate may occur in a generally vertical orientation. The compressive members may be comprised of rotatable rollers. The through-holes may be straight bores arranged through the pattern plate. The through-holes may be openings having a hemispherical depression on one side of the plate in communication with a bore from the side of the pattern plate. The through-holes may be openings through the pattern plate having a pinched waist portion. The bores may have a slot arranged thereacross to define a keyway on at least one side of the pattern plate. The first compressive member and the second compressive member may be hinged together on a hinge pair member arrangement to provide pre-aligned mating of the pattern plate and the wafer/substrate. The compressive members may be supported by an articulable support to move the compressive members side to side with respect to one another and the pattern plate pinched therebetween. The process may include pivoting the pattern plate into mating alignment with the wafer/substrate for initiation of transfer of solder from the pattern plate to the wafer/substrate. The process may include applying an energy field to said pattern plate to facilitate void free production of solder bumps in said pattern plate.

The invention also comprises an apparatus for the manufacture of a wafer substrate for use in the semiconductor industry, comprising: a first compressive member and a second compressive member arranged in an opposed, compressibly displaceable, spaced-apart relationship; a heatable, chillable pattern plate disposed between the compressive members, the pattern plate having a plurality of aligned through-holes arranged thereon; and wherein the first compressive member and the second compressive member have correspondingly curved facing surfaces to effect an excess solder removal operation during compression of said pattern plate therebetween. An activatable energy generator may be arranged within or in communication with the pattern plate to help fill the through holes in the pattern plate with solder. The through-holes may be of non-cylindrical shape. The first and second compressive members may be rotatable rollers.

BRIEF DESCRIPTION OF THE DRAWINGS

The objects and advantages of the present invention will become more apparent when viewed in conjunction with the following drawings, in which.

DETAILED DESCRIPTION OF THE PREFERRED EMBODIMENTS

Figure 1:
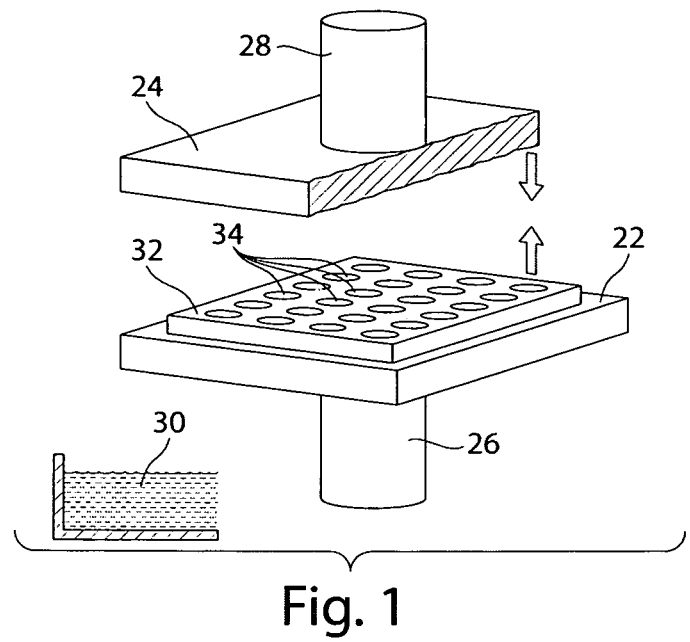
FIG. 1 is a perspective view of a compressive support assembly of a pattern plate and a pattern with molten solder filling through-holes in that pattern plate.

Referring now to the drawings in detail, and particularly to FIG. 1, there is shown the present invention, which comprises a method and apparatus for generating, depositing and forming an accurate array of solder bumps on a substrate such as a wafer of for example silicon, or on a layer of plate glass. These solder bumps are utilized to form an array of electrical contacts on that substrate, wafer of plate, for use in the electronics industry.

The initial apparatus of the present invention, represented in FIG. 1 thus comprises a solder-loading assembly 20 consisting of a first or lower support compression plate 22 and a second or upper compression plate 24 (only partially shown, for clarity). The first or lower support plate 22 of the assembly 20 may be movably supported on lower plate drive 26 and the second or upper plate 24 may be supported by an upper plate drive 28, wherein each drive 26 and 28 may be movable for compressably advancing the lower and upper plates 22 and 24 toward and apart from one another. The lower plate arrangement 22 of the assembly may be removably disposed within a liquid solder bath 30 or received within a solder deposition application arrangement. One or both of the drives 26 and 28 may have an energy field vibration or agitation generator arrangement therewith, (not shown for clarity), to enhance the process of filling the holes 34, described hereinbelow, with molten solder.

Figure 1A:
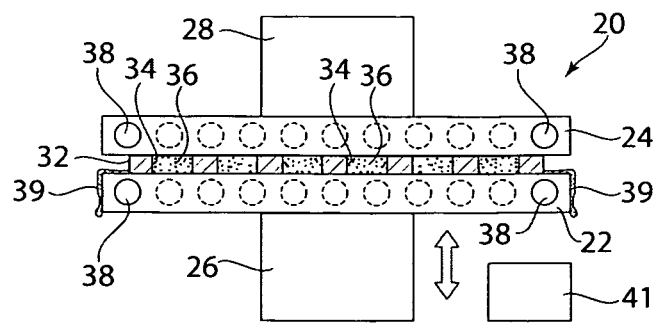
FIG. 1A is a side elevational view of the compressive plate support assembly shown in FIG. 1, with a pattern plate compressed therebetween.

A mold plate or pattern plate 32 is arranged in proper alignment on the first or lower plate 22 during operation of the solder-loading assembly 20. The pattern plate 32 has a plurality of properly aligned "through-holes" 34 disposed thereon. The pattern plate 32 is disposed on the first or lower plate 22 in the solder bath 30 or solder-deposition arrangement so as to supply completely void-free molten solder 36 in those through-holes 34 thereon. The first or lower plate 22 and the second or upper plate 24 are then brought pressingly together facing one another with the now solder-filled pattern plate 32 sandwiched therebetween, as represented in FIG. 1A. During this compression stage between the first or lower plate 22 and the second or upper plate 24, the excess molten solder 39 is pressed away or "squeegeed" off of the pattern plate 32, that pattern plate 32 then being preferably chilled by a chill means 38 in the lower plate 22 or within the assembly 20, to a temperature sufficient to solidify the solder 36 in the through-holes 34 in that now "excess-solder-free" pattern plate 32. A vibration means, an ultrasound means or an electromechanical energy field generator 41 may, in a further embodiment, be utilized to help effect void-free solder-filling the through-holes 34 in a step in this process, and also as a further embodiment in the separation of the pattern plate 32 from those solder bumps 36 in a further step in this inventive process.

Figure 2:
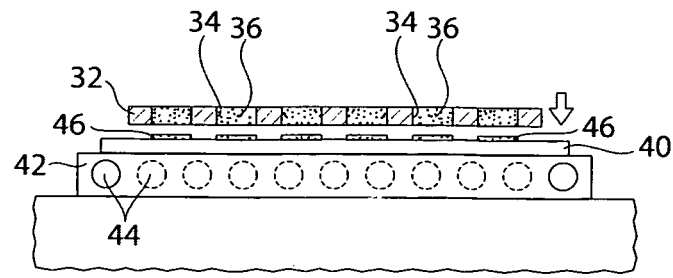
FIG. 2 is a side elevational view of a pattern plate with solder filled through-holes thereon, being placed in alignment with a wafer of substrate therebeneath.
Figure 3:
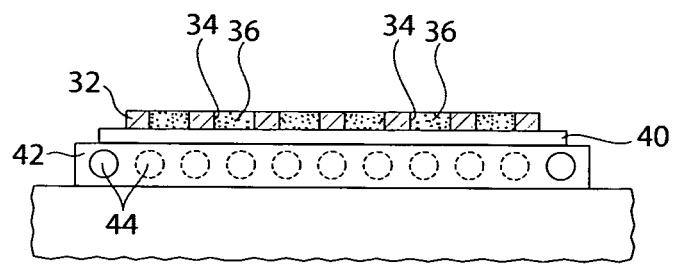
FIG. 3 is a side elevational view of a pattern plate and substrate supported on a temperature controlled support.
Figure 4:
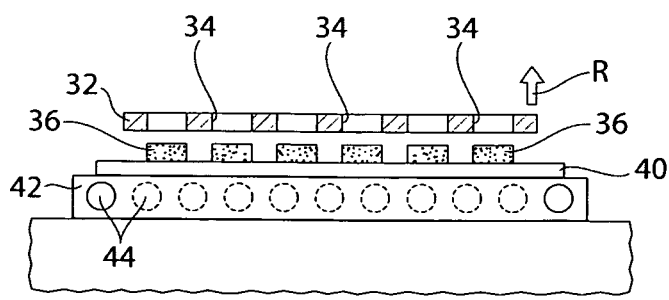
FIG. 4 is a side elevational view of a pattern plate being removed from a substrate or wafer with its solder bumps left disposed therebehind on that substrate.
Figure 5:
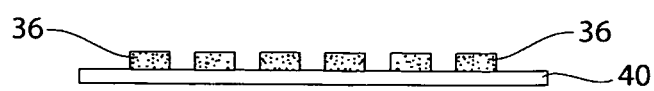
FIG. 5 is a side elevational view of a substrate or wafer with the solder bumps disposed thereon.

The now solidified, void-free solder 36 in the now excess-solder free pattern plate 32 is transferred to an awaiting substrate 40 such as a silicon wafer, or a plate glass substrate, in proper alignment therewith, as represented in FIG. 2. The wafer or substrate 40 to which the pattern plate 32 is alignably disposed, may be resting upon or in contact with a wafer supporting base 42 with a heater and/or chill means 44 arranged therewithin. The wafer substrate 40 and pattern plate 32 may then be heated to a temperature above the melting point of the solder 36 within the through-holes 34 of the pattern plate 32. The now aligned through-holes 34 adheringly deposit their bumps of solder 36 onto the aligned wafer 40 therebeneath, as represented in FIG. 3. The pattern plate 32 is preferably then liftably removed (as represented by arrow "R") from the wafer substrate 40, the through-holes 34, now empty, and with the solder bumps 36 now adheringly disposed on their particular pads 46 on the now cooled wafer or substrate 40 therebeneath, as is represented in FIG. 4. That substrate or wafer 40 with the appropriate free-standing solder bumps 36 which are now aligned and secured thereon, and separated from its chill plate base 42 for subsequent further processing, is represented in FIG. 5.

Figure 6:
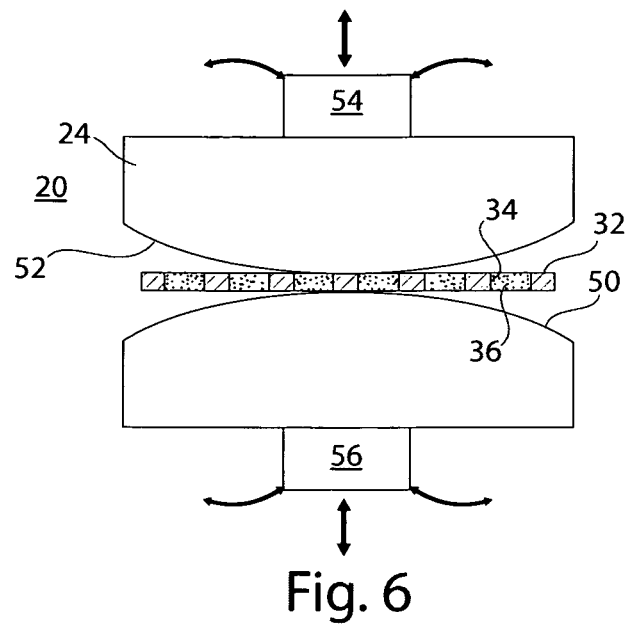
FIG. 6 is a side elevational view of a further embodiment of the compression plates initially shown in FIG. 1.

In a further embodiment of the assembly 20 of the present apparatus as shown in FIG. 6, the first or lower compression plate 22 may have a slightly spherically convex or cylindrically shaped uppermost surface 50 thereon and the second or upper plate 24 may have a corresponding cylindrically or a somewhat convex shaped surface 52 thereon, as represented in FIG. 6, so as to provide a rollable or rockable "squeegee" effect to a pattern plate 32 supportably compressed therebetween. Such a curved upper plate 24 and correspondingly curved lower support plate 22 could be articulated side-to-side by an articulable upper and lower support 54 and 56 to provide a squeezing and excess solder-removal action to a pattern plate 32 with its associated through-holes 34 with temporarily molten solder 35 therein. Such articulable excess solder removal would thus shorten the manufacturing process by combining several steps into one operation of filling those through-holes 34 after the "bath" 30, and subsequently compressively and/or squeegingly cleaning the surface of the pattern plate 32 almost simultaneously.

Figure 7:
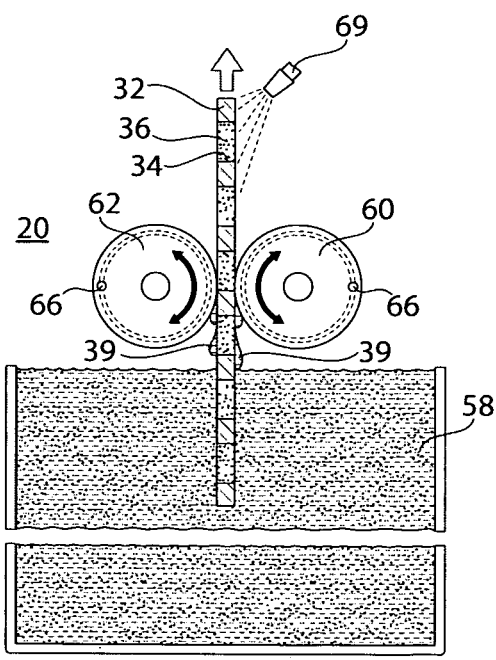
FIG. 7 is a further embodiment of the solder deposition arrangement of a pattern plate, with a further embodiment of the compressive plates.

A further embodiment of the assembly 20 utilized in the compression operation as applied to a pattern plate 32, is represented in FIG. 7, which assembly comprises the advancement of a pattern plate 32 with its respective aligned through-holes 34 therewith being pulled preferably vertically or "near vertical" movement from a solder bath 58, while being rolled or "squeegeed" between a pair of compressive roller members 60 and 62. Such compressive members 60 and 62 in one preferred embodiment thereof, would comprise a pair of biasedly-opposed rollers 60 and 62 compressing and advancing a pattern plate 32 therebetween, thus compressing each individual through-hole 34 therebetween and simultaneously squeegeeing any excess molten solder 39 therefrom. Such compression and squeegeeing would thus foreshorten such a through-hole 34 solder filling manufacturing method. The biasedly opposed pair of roller apparatus or squeegee roller members 80 and 62 may be correspondingly chilled by a chill means 66 therein, so as to chill the molten solder 36 in those through-holes 34 in that particular pattern plate 32, or by adjacent chill means 69 acting upon the plate 32 upon its movement.

Figures 8, 9:
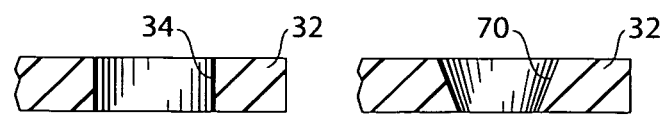
FIG. 8 is a side elevational view, in section, of a pattern plate with a through-hole arranged therein.
FIG. 9 is a further view of a pattern plate with a further embodiment of a through-hole therein.

The particular through-holes 34 may nave various cross-sectional configurations to suit particular wafer requirements. Such a pattern plate 32 in one embodiment, may have a straight through-bore or hole 34 therethrough, as is represented in the sectional view shown in FIG. 8. In another further embodiment of that pattern plate 32, the through-hole 34 may be a tapered solder-fillable through-hole 70, so as to create a tapered or conical shape to a solder bump subsequently applied to a substrate.

Figure 10:
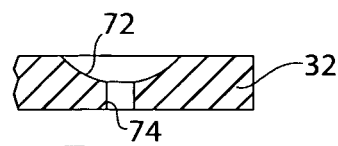
FIG. 10 is a further embodiment of a pattern plate with a depressive through-hole therein.
Figure 11:
FIG. 11 is yet a further embodiment of a pattern plate with a pinched waist through-hole therewith.
Figure 12:
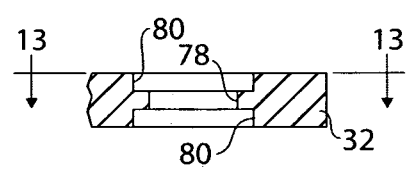
FIG. 12 is still another further embodiment of a pattern plate with a through-hole therewith.

In yet a further embodiment of the through-hole configuration in a pattern plate 32, as represented in FIG. 10, a generally hemispherical-shaped depression 72 is arranged on one side of the pattern plate 32, with a through-hole 74 in the other side of that pattern plate 32 in communication with the hemispherical depression 72. A yet further embodiment of the through-hole configuration for a pattern plate 32 would be a hour-glass or pinched-waist 76 configuration to the through-hole, as represented in FIG. 11, wherein that pattern plate 32 may be subsequently etched-away on deposition of that pinched-waist configuration 76 of solder 36 applied to a wafer or substrate.

Figure 13:
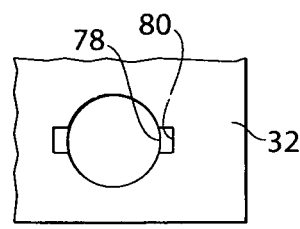
FIG. 13 is a view taken along the lines 13-13 of FIG. 12.

A still further configuration of that through-hole in a pattern plate 32 may be a straight bore 78 therethrough with a slot arrangement 80 disposed on both the top side and the lower side of the patterned plate to provide a "keyway" effect therewithin, as is represented in FIG. 13.

Figure 14:
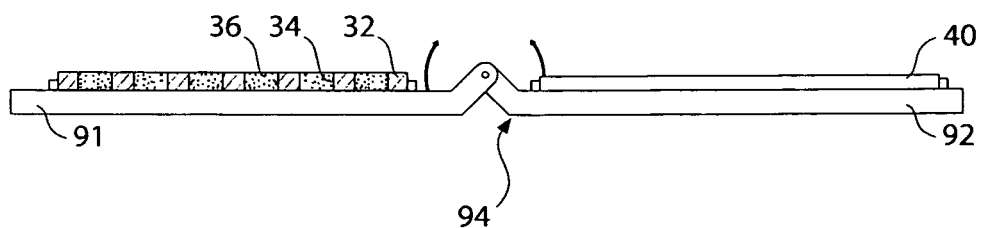
FIG. 14 is a side elevational view of an alignment mechanism for joining a pattern plate with solder therewithin and any substrate or wafer, in an alignment optimizing operation.

Alignment of a pattern plate 32 and a wafer or substrate 40 in the prior art is often an operation which consumes time and expense. One such apparatus for minimizing the expense, the time and the possible inaccuracies associated therewith, would be to present an apparatus 90 for supporting the patterned plate 32 in a hinged-correspondence to a base 92 for supporting the wafer 40. Pivotably moving the support 91 for the pre-aligned pattern plate 32 and the pre-aligned wafer 40 on a hinged support arrangement 94, to provide automatic and prompt pivotable self-alignment therebetween, preceding a heating and chilling operation of the pattern plate 32 with its solder 36 filled through-holes 34 therewith for the ultimate deposition of those solder 36 as "bumps" onto that wafer 40 is presented herewith, in FIG. 14.

We claim:

1. A process for the manufacture of a wafer substrate for use in the semiconductor industry, comprising:
    arranging a first compressive rotatable roller member and a second compressive rotatable roller member in an opposed, compressibly displaceable, spaced-apart relationship, with a pattern plate disposed therebetween, said pattern plate having a plurality of aligned through-holes arranged thereon;
    filling said through-holes with a molten solder;
    compressing said solder and pattern plate between said first and second opposed compressive rotatable roller members to compact said solder therein and cleans said pattern plate of excess solder;
    chilling said pattern plate to solidify said molten solder in said through-holes; and
    removing said pattern plate from said spaced-apart compressive rotatable roller members.

2. The process as recited in claim 1, including:
    placing said pattern plate on said wafer substrate in an aligned manner;
    heating solder in said through-holes in said pattern plate so as to melt and cause adherence of said solder to said wafer as solder bumps thereon.

3. The process as recited in claim 1, wherein said first compressive member and said second compressive member have correspondingly curved facing surfaces to effect an excess solder removal operation during compression of said pattern plate therebetween.

4. The process as recited in claim 1, wherein said compressive members are plates.

5. The process as recited in claim 3, wherein said curved facing surfaces of said compressive members are of slightly cylindrical shape.

6. The process as recited in claim 1, wherein said pattern plate is arranged in a generally vertical orientation.

7. The process as recited in claim 1, wherein said through-holes in said pattern plate are straight bores arranged therethrough.

8. The process as recited in claim 1, wherein said through-holes in said pattern plate are openings having a hemispherical depression on one side of said pattern plate in communication with a bore from the other side of said pattern plate.

9. The process as recited in claim 1, wherein said through-holes are openings through said pattern plate having a pinched waist portion.

10. The process as recited in claim 7, wherein said bores have a slot arranged thereacross to define a keyway on at least one side of said pattern plate.

11. The process as recited in claim 1, wherein said first compressive member and said second compressive member are hinged together on a hinge pair member arrangement to provide pre-aligned mating of said pattern plate and said wafer.

12. The process as recited in claim 3, wherein said compressive members are supported by an articulable support to move said compressive members side to side with respect to one another and said pattern plate pinched therebetween.

13. The process as recited in claim 11, including:
    pivoting said pattern plate into mating alignment with said wafer for initiation of transfer of solder from said pattern plate to said wafer.

14. The process as recited in claim 1, including:
    applying an energy field to said pattern plate to facilitate void free production of solder bumps in said pattern plate.

15. An apparatus for the manufacture of a wafer substrate for use in the semiconductor industry, comprising:
    a first compressive rotatable member and a second compressive rotatable member arranged in an opposed, compressibly displaceable, spaced-apart relationship;
    a heatable, chillable pattern plate disposed between said compressive members, said pattern plate having a plurality of aligned through-holes arranged thereon; and
    said first compressive member and said second compressive member have correspondingly curved facing surfaces to effect an excess solder removal operation during compression of said pattern plate therebetween.

16. The apparatus as recited in claim 15, including an activatable energy generator arranged with said pattern plate to help fill said holes in said pattern plate with solder.

17. The apparatus as recited in claim 15, wherein said through-holes are of non-cylindrical shape.

18. A process for the manufacture of a wafer substrate for use in the semiconductor industry, comprising:
    arranging a first compressive member and a second compressive member in an opposed, compressibly displaceable, spaced-apart relationship, with a pattern plate disposed therebetween, said pattern plate having a plurality of aligned through-holes arranged thereon;
    filling said through-holes with a molten solder;
    compressing said solder and pattern plate between said first and second opposed compressive members to compact said solder therein and cleans said pattern plate of excess solder;
    chilling said pattern plate to solidify said molten solder in said through-holes; and
    removing said pattern plate from said spaced-apart compressive members, wherein said first compressive member and said second compressive member have correspondingly curved facing surfaces of slightly cylindrical shape, to effect an excess solder removal operation during compression of said pattern plate therebetween.

* * * * *